(12) United States Patent
Gebara et al.

(10) Patent No.: US 7,692,480 B2
(45) Date of Patent: Apr. 6, 2010

(54) SYSTEM TO EVALUATE A VOLTAGE IN A CHARGE PUMP AND ASSOCIATED METHODS

(75) Inventors: Fadi Hikmat Gebara, Austin, TX (US); Jente Benedict Kuang, Austin, TX (US); Paul D. Muench, Poughkeepsie, NY (US); Michael A. Sperling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/168,139

(22) Filed: Jul. 6, 2008

(65) Prior Publication Data

US 2010/0001766 A1  Jan. 7, 2010

(51) Int. Cl.
*G05F 1/10* (2006.01)
(52) U.S. Cl. ..................................... 327/536
(58) Field of Classification Search ................. 327/535, 327/536, 537
See application file for complete search history.

(56) References Cited

U.S. PATENT DOCUMENTS

| | | | |
|---|---|---|---|
| 3,602,799 A | 8/1971 | Guillen et al. ............. 323/283 |
| 4,931,844 A | 6/1990 | Zommer ...................... 257/48 |
| 5,045,773 A | 9/1991 | Westwick et al. ........... 323/316 |
| 5,519,310 A | 5/1996 | Bartlett ....................... 323/316 |
| 6,285,622 B1 | 9/2001 | Haraguchi et al. .......... 365/226 |
| 6,424,578 B2 | 7/2002 | Sim et al. .............. 365/189.09 |
| 6,919,756 B2 | 7/2005 | Callaway et al. ............ 327/536 |
| 6,980,047 B1 * | 12/2005 | Kuo ............................ 327/537 |
| 7,068,114 B2 * | 6/2006 | Nishiyama .................... 331/57 |
| 7,109,782 B2 * | 9/2006 | Kase ........................... 327/534 |
| 7,224,207 B2 * | 5/2007 | Chou et al. .................. 327/536 |
| 7,486,128 B2 * | 2/2009 | Yen et al. .................... 327/536 |

* cited by examiner

*Primary Examiner*—Jeffrey S Zweizig
(74) *Attorney, Agent, or Firm*—William A. Kinnaman, Jr.; Lynn L. Augspurger

(57) ABSTRACT

A system to evaluate a voltage in a charge pump may include a transistor, and a transistor drain carried by the transistor with the transistor drain receiving a reference current. The system may also include a transistor gate carried by the transistor and connected to the transistor drain. The system may further include an additional transistor and an additional transistor gate carried by the additional transistor and connected to the transistor gate. The system may additionally include an additional transistor drain to receive the reference current mirrored from the additional transistor.

7 Claims, 6 Drawing Sheets

SYSTEM TO EVALUATE A VOLTAGE IN A CHARGE PUMP AND ASSOCIATED METHODS

RELATED APPLICATIONS

This application contains subject matter related to the following co-pending application entitled "System to Generate a Current Reference for a Charge pump and Associated Methods" and having an Ser. No. 12/168,133, the entire subject matter of which is incorporated herein by reference in its entirety. The aforementioned application is assigned to the same assignee as this application, International Business Machines Corporation of Armonk, N.Y.

FIELD OF THE INVENTION

The invention relates to the field of charge pumps, and, more particularly, to charge pump voltage generators.

BACKGROUND OF THE INVENTION

A charge pump is an electrical circuit that can take in a direct current ("DC") voltage and generate an output voltage that is higher than the original. An alternate configuration is a negative charge pump which generates a voltage that can be below ground.

A prior art embedded dynamic random access ("eDRAM") memory cell is illustrated in FIG. 1. During a write to this memory cell, a high voltage is put on the 'Gate' and the voltage on the 'Node' 11 gets stored by the capacitor 13. The higher the voltage, the faster the capacitor will be charged. A charge pump can be used to generate this high voltage.

During a read of the memory cell, a high voltage is put on the 'Gate' 15 and the voltage that is stored on the capacitor 13 can be read at the 'Node' 11. The higher the voltage, the faster the read of the memory cell.

During standby, the gate voltage will be driven low to turn off the N-Type transistor 17. Leakage thru this transistor 17 will drain the capacitor. A charge pump can be used to generate this negative voltage to minimize the leakage.

With reference to FIGS. 2-4, in a typical positive charge pump, the positive charge pump will create a new voltage that is higher than the power supply (called VPP). A comparison is usually done to figure out whether the output voltage is high enough. The compare is usually made between some reference voltage and a divided down output voltage.

If the output voltage is too low, the pump can be activated. Looking now at FIG. 2, we see P-type 19 and N-type 21 transistors which act as digital switches in FIGS. 3 & 4. A shorted connection refers to the transistor switch being closed while an open connection refers to the transistor switch being open. There are two phases of operation of the charge pump, which are charging and pumping. During charging shown in FIG. 3, the power supply voltage VDD appears across the capacitor 23. During pumping, the charge built up across the capacitor 23 can be discharged into the output VPP. Together with the comparison and reference voltage these components may make up a charge pump system.

In addition, U.S. Pat. No. 7,215,181 to Hahn et al. and U.S. Pat. No. 7,038,945 to Kessenich both disclose the standard method of comparing a reference voltage to a generated voltage in a voltage generator. Both patents disclose adding a resistive voltage divider from the generated voltage to ground.

SUMMARY OF THE INVENTION

In view of the foregoing background, it is an object of the invention to evaluate a voltage in a charge pump output at a node.

This and other objects, features, and advantages in accordance with the invention are provided by a system to evaluate a voltage in a charge pump that may include a transistor, and a transistor drain carried by the transistor with the transistor drain receiving a reference current. The system may also include a transistor gate carried by the transistor and connected to the transistor drain.

The system may further include an additional transistor and an additional transistor gate carried by the additional transistor and connected to the transistor gate. The system may additionally include an additional transistor drain to receive the reference current mirrored from the additional transistor.

The system may also include a resistor, and a node between the resistor and the transistor drain to establish a comparison voltage based upon the mirrored reference current. The resistor and the transistor drain may only have the node between them.

The resistor may receive the mirrored reference current. The system may further include a capacitor in parallel with the resistor. The transistor and the additional transistor may comprise n-type transistors.

Another aspect of the invention is a method of evaluating a voltage in a charge pump. The method may include receiving a reference current at a transistor drain. The method may also include mirroring a current using an additional transistor. The method may further include receiving a mirrored current at a resistor. The method may additionally include establishing a comparison voltage based upon the mirrored current at a node between the resistor and the transistor drain. The method may also include providing a capacitor in parallel with the resistor.

DETAILED DESCRIPTION OF THE PREFERRED EMBODIMENTS

Figure 1:
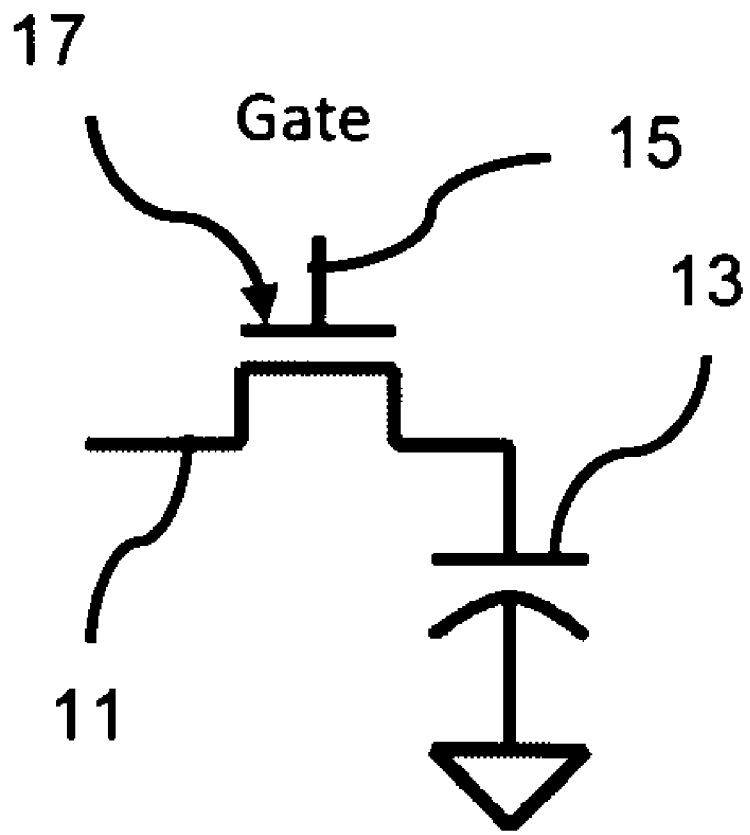
FIG. 1 is a schematic block diagram of a prior art eDRAM charge pump.
Figures 2, 3, 4:
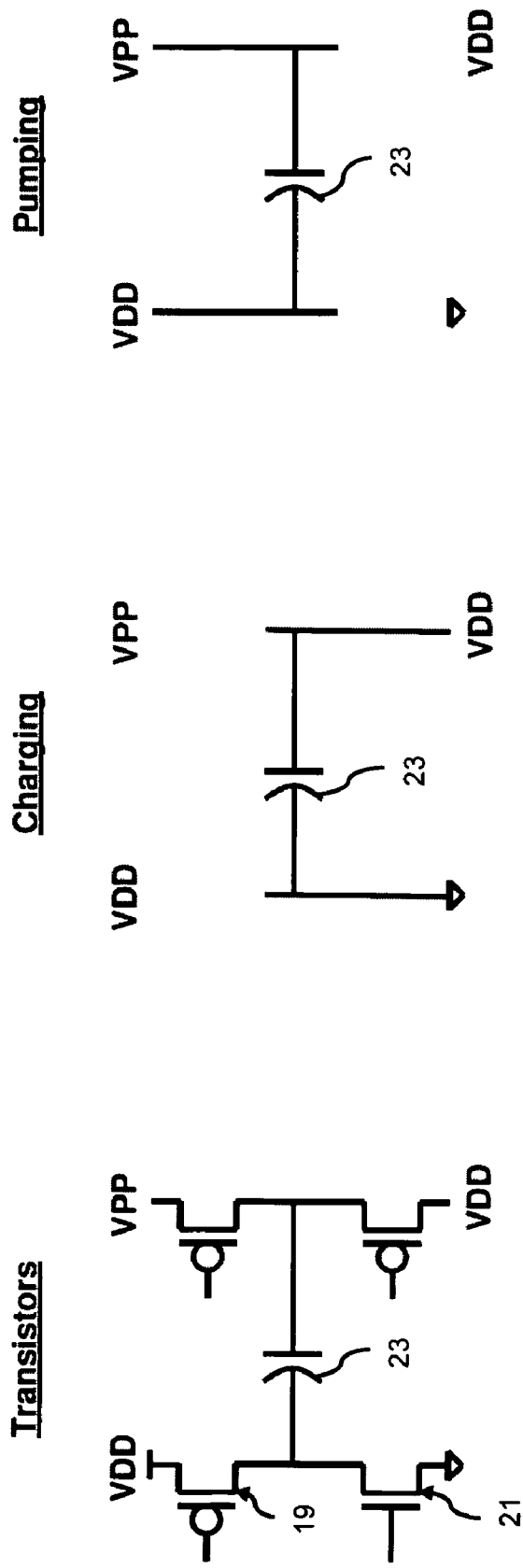
FIG. 2 is a schematic block diagram of a prior art positive charge pump.
FIG. 3 is a schematic block diagram of the prior art positive charge pump of FIG. 2 charging.
FIG. 4 is a schematic block diagram of the prior art positive charge pump of FIG. 2 pumping.

The invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As will be appreciated by one skilled in the art, the invention may be embodied as a method, system, or computer program product. Furthermore, the invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, or a magnetic storage device.

Computer program code for carrying out operations of the invention may be written in an object oriented programming language such as Java, Smalltalk, C++ or the like. However, the computer program code for carrying out operations of the invention may also be written in conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Figure 5:
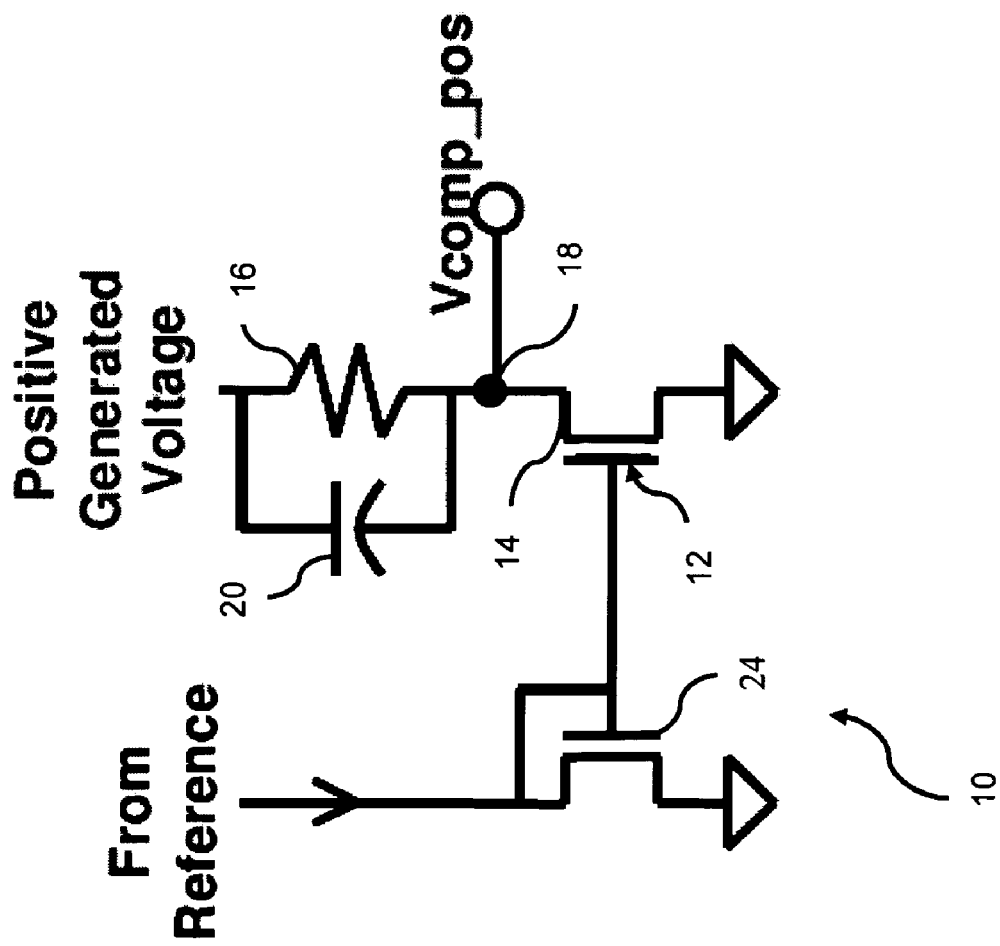
FIG. 5 is a schematic block diagram of a system to evaluate a voltage in a charge pump in accordance with the invention.

Referring to FIG. 5, a system 10 to evaluate a voltage in a charge pump includes a transistor 12, and a transistor drain 14 carried by the transistor with the transistor drain mirroring a reference current from an additional transistor 24, for example. The system 10 also includes a resistor 16 receiving a generated current, for instance. The system 10 further includes a node 18 between the resistor 16 and the transistor drain 14 to establish a comparison voltage based upon the reference current and the generated current, for example.

In one embodiment, the resistor 16 receives the mirrored current. In another embodiment, the system 10 also includes a capacitor 20 in parallel with the resistor 16. In another embodiment, the additional transistor 24 and the transistor 12 comprise n-type transistors as will be appreciated by those of skill in the art.

Figure 6:
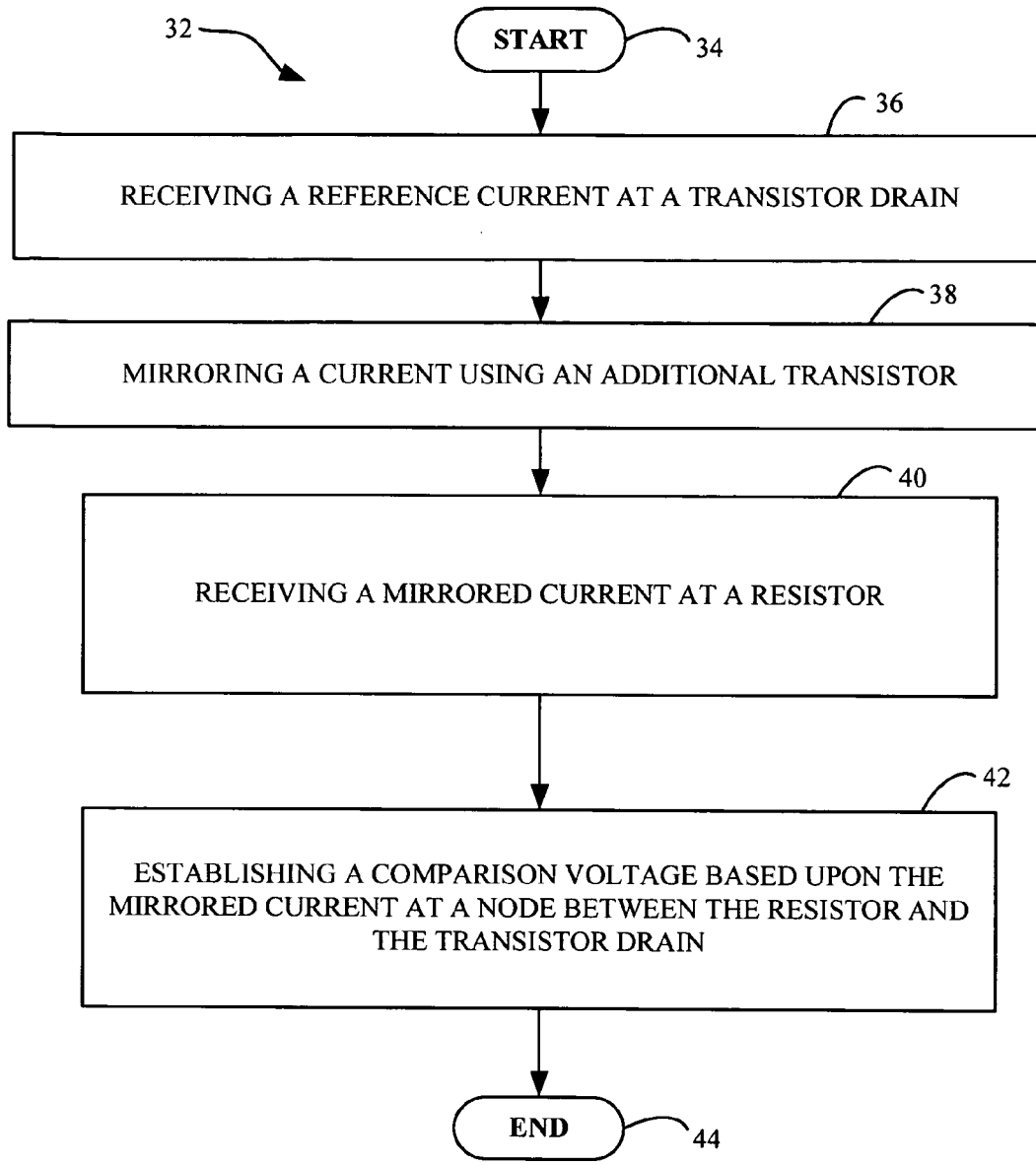
FIG. 6 is a flowchart illustrating method aspects according to the invention.

Another aspect of the invention is a method of evaluating a voltage in a charge pump, which is now described with reference to flowchart 32 of FIG. 6. The method begins at Block 34 and may include receiving a reference current at a transistor drain at Block 36. The method may also include mirroring a current using an additional transistor at Block 38. The method may further include receiving a mirrored current at a resistor at Block 40. The method may additionally include establishing a comparison voltage based upon the mirrored current at a node between the resistor and the transistor drain at Block 42. The method ends at Block 44.

Figure 7:
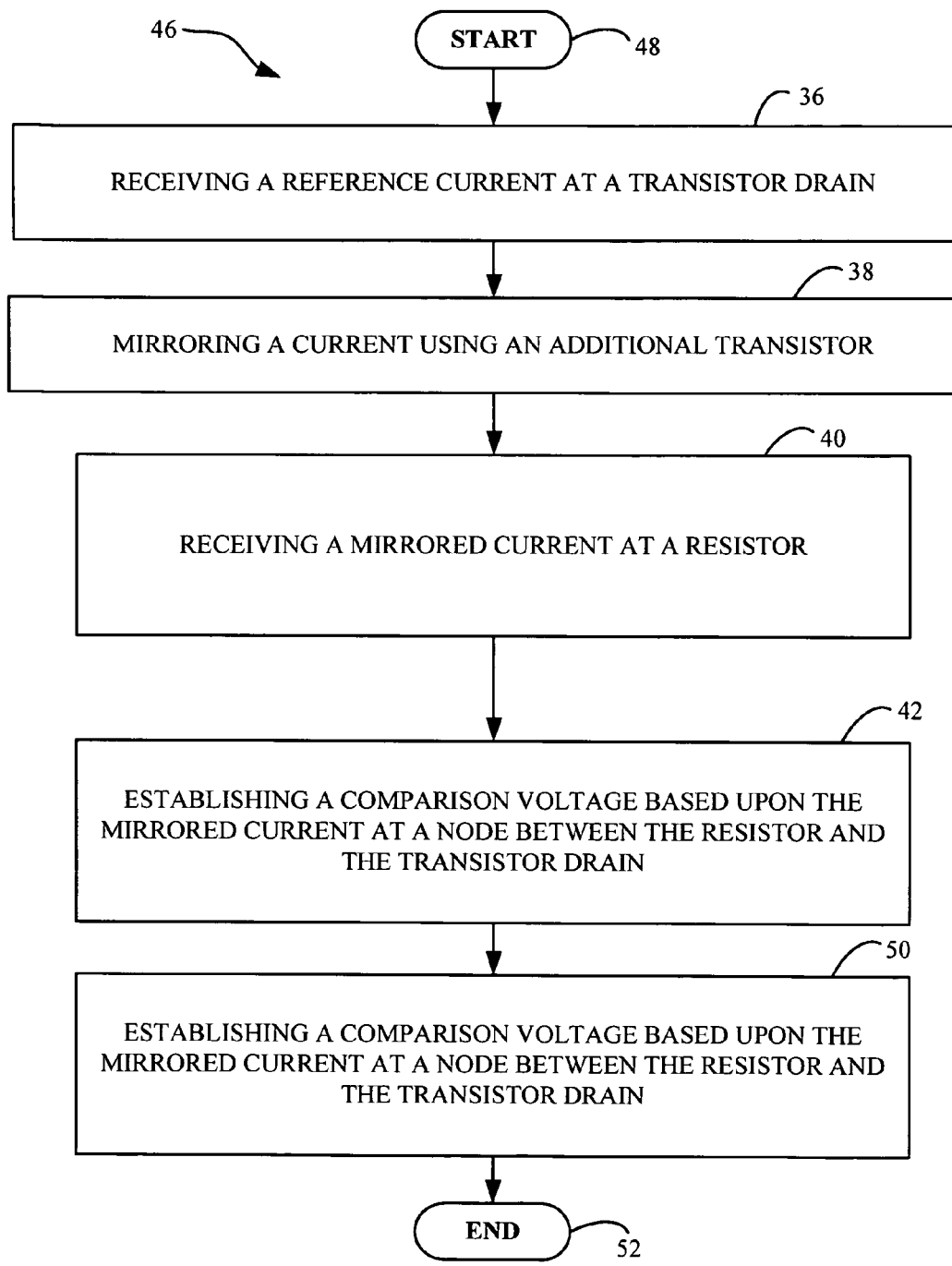
FIG. 7 is a flowchart illustrating method aspects according to the method of FIG. 6.

In another method embodiment, which is now described with reference to flowchart 46 of FIG. 7, the method begins at Block 48. The method may include the steps of FIG. 6 at Blocks 36, 38, 40, and 42. The method may also include providing a capacitor in parallel with the resistor at Block 50. The method ends at Block 52.

In view of the foregoing, the system 10 evaluates a voltage in a charge pump to enable sensing of voltages greater than the supply voltage. This is particularly important in charge pump voltage generators where you want to compare the final voltage to a reference voltage.

In contrast, known solutions for such a comparison system mostly involve adding a resistive voltage divider from the generated voltage to ground. This has the drawback of not changing 1:1 with the generated voltage. For example, if the divide ratio is 1/2 and the generated voltage moves by 100 mV, the output of the resistive divider would only move by 50 mV.

Another issue occurs when the generated voltage is a negative voltage. In this case the resistive divider goes from the generated voltage to the power supply. This is a significant problem since such will cause the generated voltage to be a function of the power supply, which can vary by large amounts.

As noted above, the system 10 uses a current across a resistor, e.g. resistor 16, rather than a resistive voltage divider to enable more accurate sensing of the generated voltage. In addition, when a capacitor, e.g. capacitor 20, is placed in parallel with the resistor, e.g. resistor 16, sensing will be accurate at both high frequencies and at Direct Current. This structure and prophetic examples of such a structure also enable both a positive generated voltage and a negative generated voltage to be compared to the same reference voltage without any power supply sensitivity.

Figure 8:
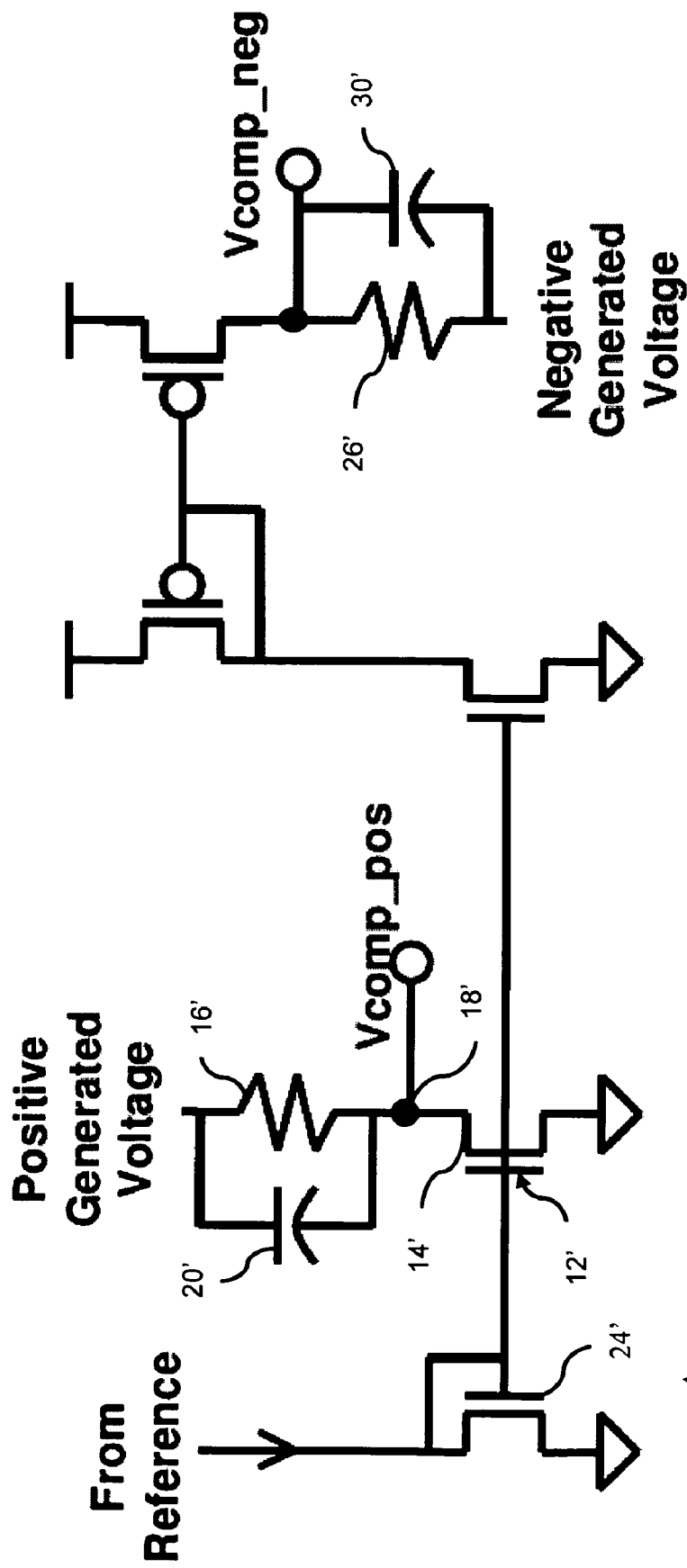
FIG. 8 is a schematic block diagram of a system to evaluate a voltage in a charge pump in accordance with the system of FIG. 5.

Referring to FIG. 8, one prophetic example of the system 10' is now described. In this embodiment, a current coming from a reference circuit is mirrored thru N-type transistors, e.g. transistor 12'. One leg of this current flows thru a resistor, e.g. resistor 16', tied from the transistor drain, e.g. transistor drain 14', to the positive generated voltage. The resulting IR drop creates the positive comparison voltage (Vcomp_pos). Moreover, there is a capacitor, e.g. capacitor 20', in parallel that provides a high speed path from the generated voltage to the comparison voltage. Thus a change at the generated voltage, regardless of the frequency, will be seen at the comparison.

There is an additional current mirror and resistor/capacitor pair, e.g. resistor 26'/capacitor 30', to create the negative comparison voltage (Vcomp_neg). Like the positive voltage, this voltage will react to changes on the generated voltage quickly and accurately. It can be shown thru Ohms law that if we compare both comparison voltages to the same reference, the difference between the positive and negative generated voltages in the charge pump system 10' will remain constant and have no sensitivity to power supply or process. In addition, the current mirrors can be cascoded for more power supply rejection.

The capabilities of the system 10 can be implemented in software, firmware, hardware or some combination thereof.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention. Furthermore, the use of the terms a, an, etc. do not denote a limitation of quantity, but rather denote the presence of at least one of the referenced item.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

That which is claimed is:

1. A system to evaluate a voltage in a charge pump, the system comprising:
   a transistor;
   a transistor drain carried by said transistor, said transistor drain receiving a reference current;
   a transistor gate carried by said transistor and connected to said transistor drain;
   an additional transistor;
   an additional transistor gate carried by said additional transistor and connected to said transistor gate;
   an additional transistor drain to receive the reference current mirrored from said additional transistor;
   a resistor;
   a node between said resistor and said additional transistor drain to establish a comparison voltage based upon the mirrored reference current; and
   a capacitor in parallel with said resistor.

2. The system of claim 1 wherein said resistor and said additional transistor drain have only said node between them.

3. The system of claim 1 wherein said resistor receives the mirrored reference current.

4. The system of claim 1 wherein said transistor and said additional transistor comprise n-type transistors.

5. A method of evaluating a voltage in a charge pump, the method comprising:
   receiving a reference current at a transistor drain;
   mirroring a current using an additional transistor;
   receiving a mirrored current at a resistor;
   establishing a comparison voltage based upon the mirrored current at a node between the resistor and the additional transistor drain; and
   providing a capacitor in parallel with the resistor.

6. A system to evaluate a voltage in a charge pump, the system comprising:
   a transistor;
   a transistor drain carried by said transistor, said transistor drain receiving a reference current;
   a transistor gate carried by said transistor and connected to said transistor drain;
   an additional transistor;
   an additional transistor gate carried by said additional transistor and connected to said transistor gate;
   an additional transistor drain to receive the reference current mirrored from said additional transistor;
   a resistor;
   a node between said resistor and said additional transistor drain to establish a comparison voltage based upon the mirrored reference current and said resistor and said additional transistor drain have only said node between them; and
   a capacitor in parallel with said resistor.

7. The system of claim 6 wherein said resistor receives the mirrored reference current.

* * * * *